(12) United States Patent
Jin et al.

(10) Patent No.: US 7,557,643 B2
(45) Date of Patent: Jul. 7, 2009

(54) DE-GLITCH CIRCUIT

(75) Inventors: Darmin Jin, Fremont, CA (US); Brian Cheung, San Bruno, CA (US)

(73) Assignee: SanDisk Corporation, Milpitas, CA (US)

(*) Notice: Subject to any disclaimer, the term of this patent is extended or adjusted under 35 U.S.C. 154(b) by 89 days.

(21) Appl. No.: 11/686,828

(22) Filed: Mar. 15, 2007

(65) Prior Publication Data

US 2008/0164909 A1    Jul. 10, 2008

Related U.S. Application Data

(60) Provisional application No. 60/879,513, filed on Jan. 8, 2007.

(51) Int. Cl.
*H03K 5/00* (2006.01)

(52) U.S. Cl. .................................. 327/551; 327/34

(58) Field of Classification Search ................ None
See application file for complete search history.

(56) References Cited

U.S. PATENT DOCUMENTS

| | | | |
|---|---|---|---|
| 4,091,293 A | 5/1978 | Ando | |
| 4,132,908 A | 1/1979 | Hughes | |
| 5,027,016 A | 6/1991 | Hanna | |
| 5,155,380 A * | 10/1992 | Hwang et al. | 327/99 |
| 5,206,817 A | 4/1993 | McClure | |
| 5,341,033 A | 8/1994 | Koker | |
| 5,563,532 A * | 10/1996 | Wu et al. | 327/34 |
| 5,646,620 A | 7/1997 | Regier | |
| 5,808,486 A * | 9/1998 | Smiley | 327/34 |
| 5,815,690 A | 9/1998 | Kowert | |
| 5,940,345 A | 8/1999 | Davidson | |
| 6,137,333 A | 10/2000 | Williams | |
| 6,218,870 B1 * | 4/2001 | Wilson | 327/34 |
| 6,304,199 B1 | 10/2001 | Fang | |
| 6,348,780 B1 | 2/2002 | Grant | |
| 6,405,228 B1 | 6/2002 | Williams | |
| 6,535,024 B1 * | 3/2003 | Rochard | 327/34 |
| 6,762,631 B1 | 7/2004 | Kumar | |
| 6,778,111 B1 | 8/2004 | Zhu | |
| 7,347,340 B2 * | 3/2008 | Carola | 220/6 |
| 7,449,921 B2 * | 11/2008 | Jeung | 327/34 |
| 2003/0146778 A1 * | 8/2003 | McMahan et al. | 327/34 |
| 2006/0082391 A1 | 4/2006 | Hsu | |

* cited by examiner

*Primary Examiner*—Tuan Lam
*Assistant Examiner*—Hiep Nguyen
(74) *Attorney, Agent, or Firm*—Brinks Hofer Gilson & Lione

(57) ABSTRACT

A digital logic circuit and method for de-glitching an input signal. The circuit removes distortion that occurs during a "de-glitching" time period that follows each transition of the input signal from 0 to 1 or from 1 to 0. The circuit can remove such distortion from the input signal without substantially delaying the input signal. Specifically, the delay interposed can be much less than the duration of the de-glitching time period. One embodiment includes first and second Set-Reset flip-flops each having an input connected to receive the input signal and having an output connected to a majority circuit. A delay circuit also receives the input signal and provides an output to the majority circuit. Other embodiments replace the majority circuit with a circuit including logic gates.

20 Claims, 8 Drawing Sheets

|  | t1-t2 (X: 0-1) | t2-t3 (X: 1) | t3-t4 (X: 1-0) | t4-t5 (X: 0) |
|---|---|---|---|---|
| X | ? | 1 | ? | 0 |
| A = $Q_a$ | 1 | 1 | 1 | 0 |
| B = $Q_b^*$ | 0 | 1 | 0 | 0 |
| D | 0 | ? | 1 | ? |
| C = $XD_2^*$ | 1 | ? | 0 | ? |
| Z | 1 | 1 | 0 | 0 |

*FIG. 3*

DE-GLITCH CIRCUIT

CROSS REFERENCE TO RELATED APPLICATION

This application claims the benefit of U.S. Provisional application No. 60/879,513 filed Jan. 8, 2007.

FIELD OF THE INVENTION

The invention relates to circuits for removing distortion, noise or glitches from a digital logic signal.

BACKGROUND OF THE INVENTION

When a digital logic signal is coupled from a sending circuit to a receiving circuit, the signal can be corrupted by distortion, often referred to as glitches. A glitch can cause the signal to cross the threshold between a logic 0 and a logic 1, causing the value of the signal to be misinterpreted by the receiving circuit.

Conventional de-glitch circuits typically remove glitches from a digital input signal by requiring a change in the input signal to persist for at least a predetermined time period, referred to as the de-glitching period, before the change is propagated to the output of the de-glitch circuit. Such a de-glitch circuit is disclosed in U.S. Pat. No. 6,778,111 issued Aug. 17, 2004 to Zhu et al.

However, this type of de-glitch circuit has the disadvantage of delaying the input signal by a time greater than or equal to the predetermined de-glitching period. Some digital logic circuits will not operate correctly if their input signals are subject to such delay.

Therefore, a need exists for a de-glitch circuit that removes glitches from a digital input signal without delaying the signal by the duration of the de-glitching period.

SUMMARY OF THE INVENTION

The invention is a digital logic circuit and method for de-glitching an input signal. The invention removes distortion that occurs during a "de-glitching" time period that follows each transition of the input signal from 0 to 1 or from 1 to 0. Advantageously, the invention can remove such distortion from the input signal without substantially delaying the input signal. Specifically, the delay interposed by the invention can be much less than the duration of the de-glitching time period.

One embodiment of the invention includes first and second Set-Reset flip-flops each having an input connected to receive the input signal and having an output connected to a majority circuit. A delay circuit also receives the input signal and provides an output to the majority circuit.

Other embodiments of the invention replace the majority circuit with a circuit including logic gates.

BRIEF DESCRIPTION OF THE DRAWINGS

FIG. 3 is a timing table of the signals shown in FIG. 2.

DETAILED DESCRIPTION OF THE PREFERRED EMBODIMENTS

1. Overview of the Invention

The purpose of the invention is to remove distortion from a digital input signal. The invention only removes distortion that occurs during a time period D, referred to as the de-glitching period, that follows each transition of the input signal from 0 to 1 or from 1 to 0. The invention does not attempt to remove distortion during the time interval extending from the time D following an input signal transition (0-1 or 1-0) until the time of the next input signal transition.

The invention is especially useful to remove distortion of a digital signal caused by signal reflections between a sending circuit and a receiving circuit that are separated by a conductor that is long enough to shift the phase of the signal so as to effectively function like a transmission line. Such reflections can be caused by an impedance mismatch among the output impedance of the circuit sending the signal, the input impedance of the circuit receiving the signal, and the transmission line characteristic impedance of the conductor that couples the signal between the two circuits.

The distortion caused by such reflections generally does not effect the initial transition of the digital signal. However, reflections of a transition having inverted polarity can cause the signal to cross the threshold between a logic 0 and a logic 1. For example, after the signal transitions from 0 to 1, an inverted reflection can cause it to subsequently transition back to 0 for a brief time.

Reflections cause by impedance mismatches subside in amplitude over time. The present invention is intended to immediately recognize an initial transition of the input signal, but then ignore any subsequent transitions until after a delay period D that preferably exceeds the time required for the reflections or other distortion of the input signal to subside sufficiently to avoid logic errors. Specifically, the delay period D preferably is of sufficient duration that any reflections or other distortion of the input signal after the delay period are too low in amplitude to cause the digital logic signal to cross the threshold between logic 0 and logic 1.

Also, the delay period D preferably is less than or equal to one-half of the shortest time between transitions of the input signal other than transitions caused by distortion, that is, less than or equal to one-half the duration of the shortest possible pulse in the input signal. The reason for this will become clear in the following description of the operation of the invention.

In the following description and drawings, each digital logic signal in the de-glitch circuit is identified by an upper-case letter, and a signal that is the logical inverse of another signal is identified by appending an asterisk to the letter representing the uninverted signal.

2. Circuit Design

Figure 1:
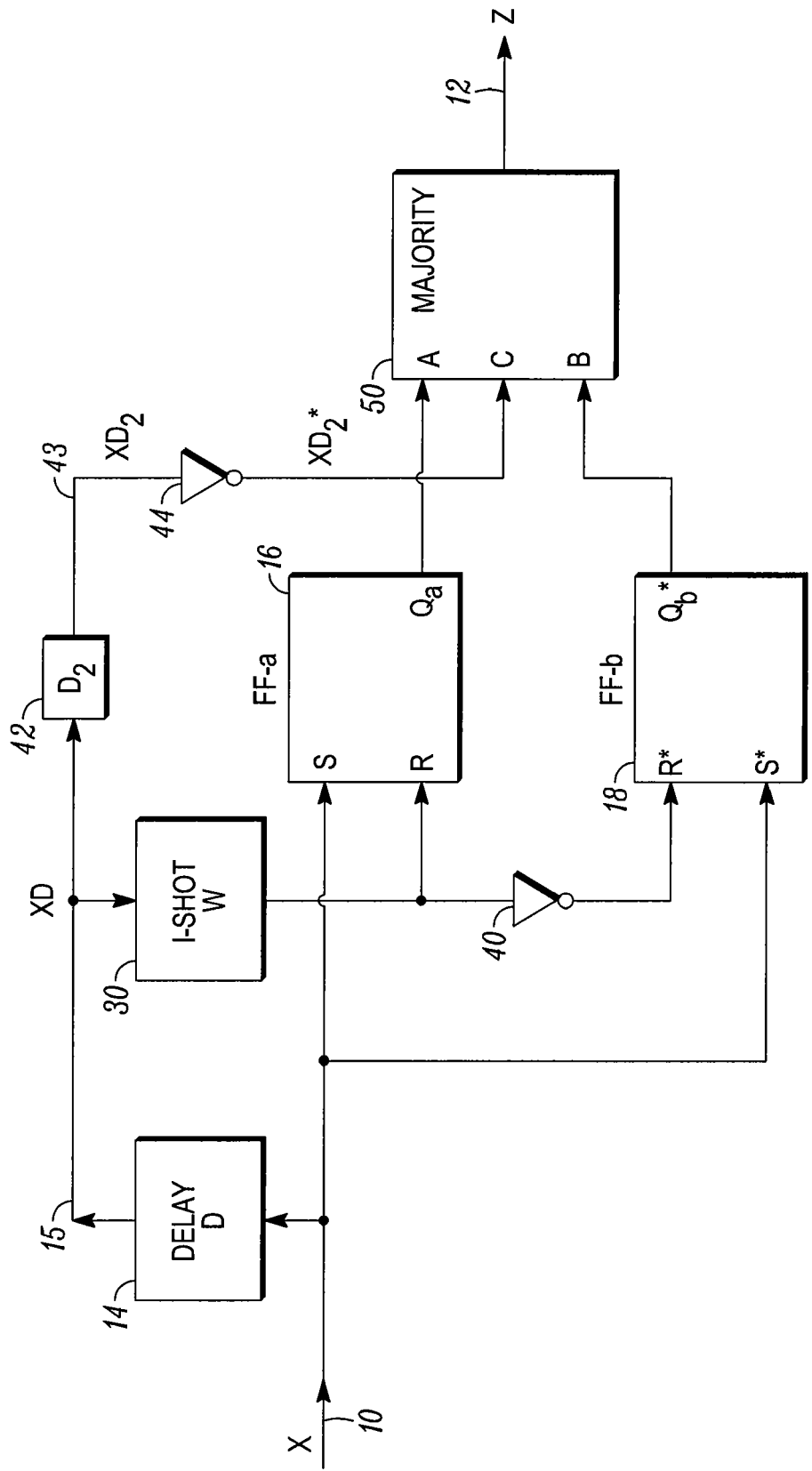
FIG. 1 is a block diagram of a de-glitch circuit according to the invention.

FIG. 1 is a block diagram of a de-glitch circuit according to a basic embodiment of the invention. The de-glitch circuit has an electrical input 10 at which it receives an input signal X and an electrical output 12 at which it outputs an output signal Z. (For brevity, the de-glitch circuit is often referred to as "the circuit" in the following description.) The de-glitch circuit uses conventional digital logic electrical circuit. Each electrical signal in the circuit is a binary logic signal, which means the value of the signal is considered to represent either a logic 0 or a logic 1, also referred to simply as 0 or 1.

The delay of period D is implemented by a first delay circuit 14, which is a conventional delay circuit having its input connected to receive the input signal X, so that it produces at its output 15 a signal XD that is a replica of the input signal X delayed by a delay duration D.

The delay duration D is 2 nanoseconds (2000 picoseconds) in our actually implemented preferred embodiment. However, the preferred amount of delay in another implementation depends on the time required for the signal distortion to subside in that implementation, as explained above.

Figure 2:
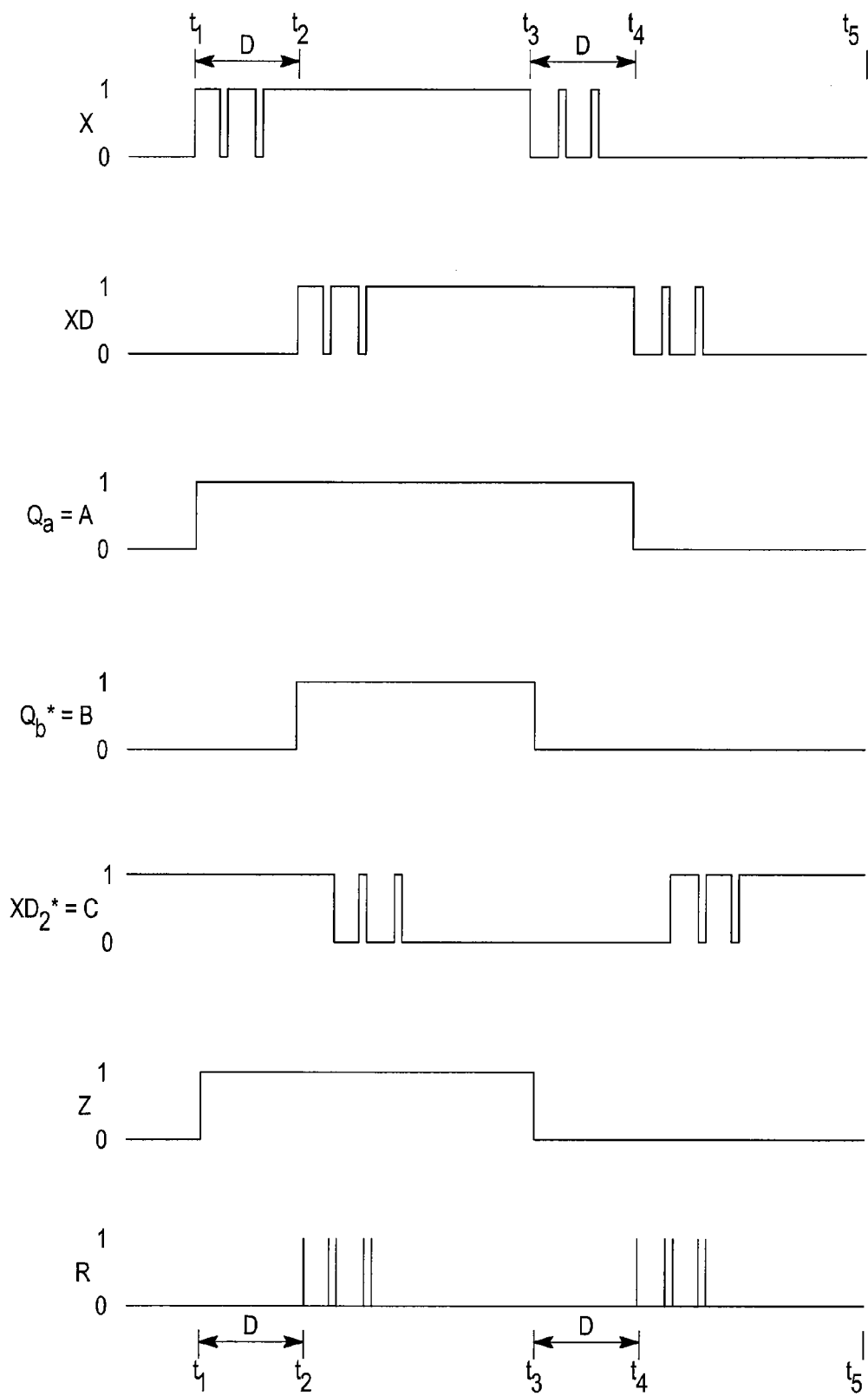
FIG. 2 is a waveform timing diagram of various signals in the de-glitch circuit of FIG. 1.

FIG. 2 is a timing diagram that explains the purpose and operation of the invention by illustrating the behavior over time of the signals within the de-glitch circuit.

FIG. 2 assumes that the input signal X and output signal Z have maintained the value 0 for a long time before time t1. At time t1, the input X transitions to 1, and the circuit almost immediately causes the output signal Z to transition to 1. Therefore, the output Z preserves the leading edge of the 0-1 transition of the input X.

The time interval from time t1 to time t2 equals the duration D of a delay established by the first delay circuit 14. During the time between t1 and t2, the output Z remains 1 irrespective of the value of the input X. Therefore, the output Z is immune to any glitches in input X (such as shown in FIG. 2) during this period of duration D following the initial 0-1 transition.

The input X and output Z remain 1 during the interval from time t2 to time t3. The duration of this interval is determined entirely by the input X, not any parameters of the de-glitch circuit. Specifically, time t3 represents the first transition of the input X from 1 to 0 subsequent to time t2.

At time t3, when the input X transitions from 1 to 0, the circuit almost immediately causes the output signal Z to transition to 0. Therefore, the output Z preserves the leading edge of the 1-0 transition of the input X.

The time interval from time t3 to time t4 equals the duration D of the delay established by the first delay circuit 14. During the time between t3 and t4, the output Z remains 0 irrespective of the value of the input X. Therefore, the output Z is immune to any glitches in input X (such as shown in FIG. 2) during this period of duration D following the initial 1-0 transition.

The input X and output Z remain 0 during the interval from time t4 to time t5. The duration of this interval is determined entirely by the input X, not any parameters of the de-glitch circuit. Specifically, time t5 represents the first transition of the input X from 0 to 1 subsequent to time t4. At time t5, when the input X transitions from 0 to 1, the circuit almost immediately causes the output signal Z to transition to 1. At this point, all signals are in the same condition as at time t1, and operation of the de-glitch circuit continues as shown in FIG. 2 beginning from time t1.

FIG. 3 depicts the same signals as FIG. 2 in the form of a table in which successive columns represent successive time intervals and each signal is represented by a row. In the column headings, the symbol "0-1" (or "1-0") represents the time interval of duration D that begins with the transition of the input signal X from 0 to 1 (or from 1 to 0). A 0 (or 1) in the table cell for a given row and column means that the signal represented by that table row must have a value of 0 (or 1) during the time interval specified in that table column. A question mark for the value of a signal means that it can alternate between 0 and 1 because of glitches in the input signal X.

The de-glitch circuit of FIG. 1 includes conventional first and second Set-Reset Flip-Flop circuits 16, 18. A "Set-Reset Flip-Flop", also commonly called an "SR Flip-Flop" or an "SR Latch", functions as follows. An SR flip-flop has either or both of two outputs called Q and Q*. (Throughout this patent specification, we append an asterisk to a symbol to mean logical "not", i.e., logical inverse.) The standard, uninverted implementation of an SR flip-flop circuit has a first input called Set or S and a second input called Reset or R. The standard inverted implementation has a first input called Set-Not or S* and a second input called Reset-Not or R*.

Figure 4:
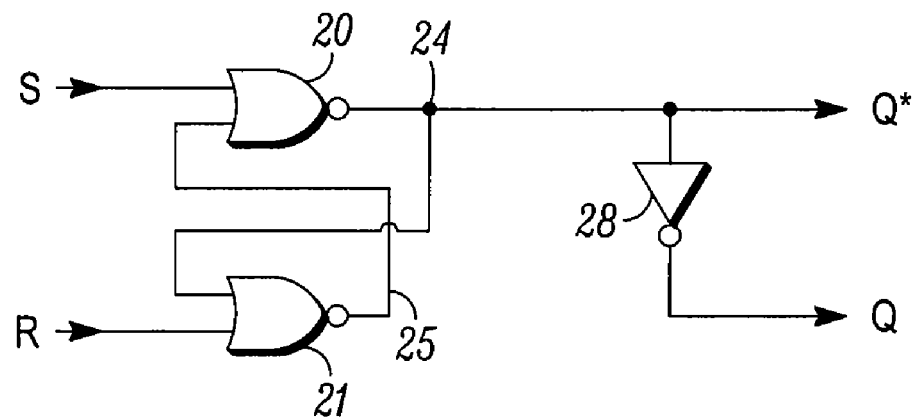
FIG. 4 is an electrical schematic of a NOR-type Set Reset flip flop.

FIG. 4 shows one common type of SR flip-flop having two NOR gates 20, 21, each of which has a first input connected to the output of the other, and each of which has a second input which is connected to the S and R input, respectively, of the SR flip flop. The Q and Q* outputs of the flip flop conventionally are the outputs of NOR gates 21 and 20, respectively. Inverter 28, which is not part of a conventional SR flip-flop, is explained below.

Figure 5:
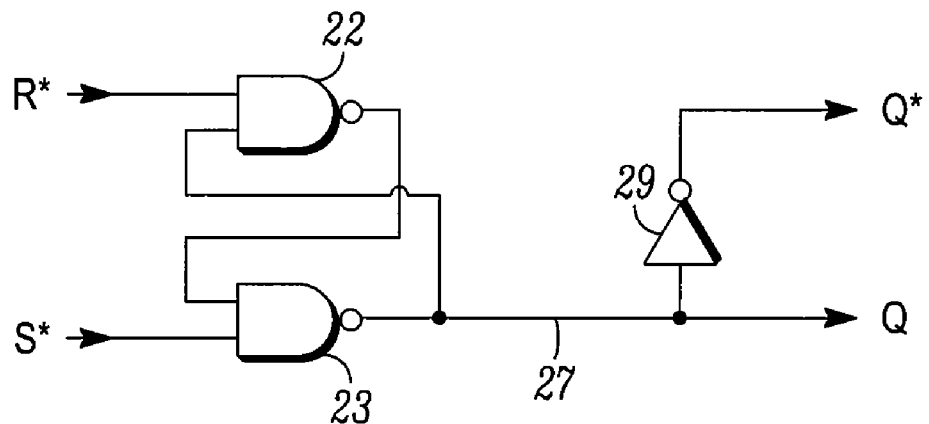
FIG. 5 is an electrical schematic of a NAND-type Set Reset flip flop.

FIG. 5 shows another common type of SR flip-flop having two NAND gates 22, 23, each of which has one input connected to the output of the other, and each of which has a second input which is connected to the R* and S* input, respectively, of the SR flip flop. The Q and Q* outputs of the flip flop conventionally are the outputs of NAND gates 23 and 22, respectively. Inverter 29, which is not part of a conventional SR flip-flop, is explained below.

In a conventional SR flip-flop, if S=1 and R=0 (or S*=0 and R*=1), then Q=1 and Q*=0; this is the Set state of the flip-flop. If S=0 and R=1 (or S*=1 and R*=0), then Q=0 and Q*=1; this is the Reset state. If S=R=0, then Q and Q* retain their previous states. There is no conventional standard behavior for an SR flip-flop when S=R=1. However, this condition occurs during operation of the de-glitch circuit of FIG. 1, so it warrants explanation. For some implementations of SR flip-flops, S=R=1 can cause the flip-flop to oscillate. However, the condition S=R=1 produces stable, predictable flip-flop behavior in the two preferred flip-flop implementations shown in FIGS. 4 and 5.

Specifically, S=R=1 is the only condition in which the outputs of the two gates within the SR flip-flop are equal rather than being logical inverses of each other. In the NOR gate implementation of FIG. 4, if S=R=1, then both NOR gates output a logic 0. In the NAND gate implementation of FIG. 5, if S=R=1 (i.e., if S*=R*=0), then both NAND gates output a logic 1.

It is preferable in the present invention for the Set input to override the Reset input of the SR flip-flops. That is, if S=R=1 or S*=R*=0, the output of the flip-flops should be the same as if S=1 and R=0 or, equivalently, S*=0 and R=1. This behavior is achieved in the NOR-type flip-flop of FIG. 4 by adding to the conventional circuit 20, 21 an inverter 28 to derive the Q output as the logical inverse of the Q* output rather than taking the Q output from the second NOR gate 21. Likewise, in the NAND-type flip-flop of FIG. 5 an inverter 29 is added to the conventional circuit 22, 23 so as to derive the Q* output as the logical inverse of the Q output rather than taking the Q* output from the first NAND gate 22.

Although FIGS. 4 and 5 show both the Q and Q* outputs of the SR flip flops, normally only one output of a given flip-flop is used, so the other output need not be implemented. Also, as explained below in the discussion of FIGS. 8 and 9, the inverter 28 (FIG. 4) or 29 (FIG. 5) can be omitted if the majority circuit 50 (described below) is implemented with an inverter (for example, inverter 62 or 63 in FIG. 8) that would be connected in series with the inverter 28 or 29. Two series-connected inverters would cancel each other out, and therefore could both be omitted.

The de-glitch circuit of FIG. 1 also includes a 1-shot circuit 30. A conventional 1-shot circuit has an output that produces a logic 1 pulse of predetermined duration "W" when its input signal transitions from 0 to 1 or from 1 to 0, but that otherwise remains at logic 0. Some conventional 1-shot circuits respond to a 0-1 transition but ignore a 1-0 transition, or vice versa. The de-glitch circuit of FIG. 1 requires a 1-shot circuit that responds to both 0-1 and 1-0 transitions of its input. Such 1-shot circuits are commercially available.

The predetermined duration "W" of the pulse produced by the 1-shot circuit should be at least long enough for the flip-flop circuits 16, 18 to respond to (i.e., change state in response to) a pulse of duration W at their respective Reset inputs. The delay duration W is 400 picoseconds in our actually implemented preferred embodiment. However, the preferred amount of delay in another implementation depends on the speed of the gates 20-23 used in the flip-flop circuits 16, 18.

Figure 6:
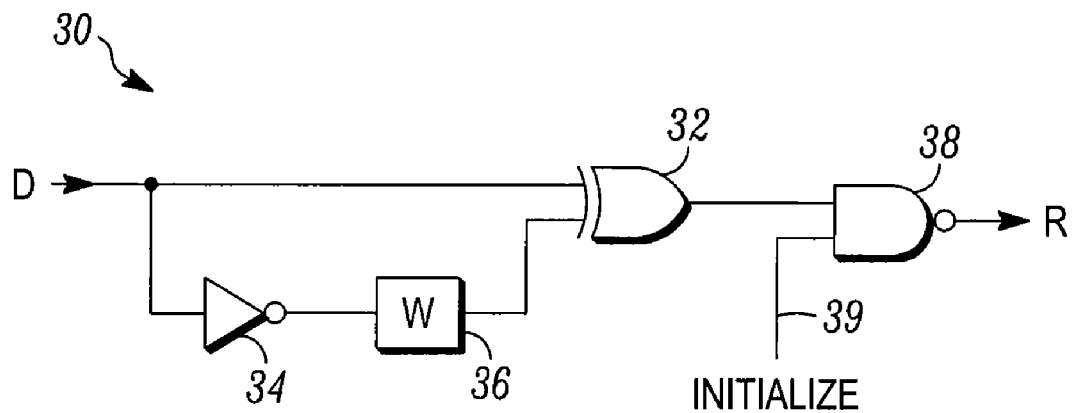
FIG. 6 is an electrical schematic of a 1-shot circuit.

FIG. 6 shows a preferred 1-shot circuit 30 that uses an exclusive-OR (XOR) gate 32, inverter 34, and delay circuit 36, where the total propagation delay of the delay circuit and the inverter equals the predetermined duration W of each pulse produced by the 1-shot. Because the propagation delay of the inverter is much smaller than that of the delay circuit 36, the latter is identified in FIG. 6 by the delay W.

The preferred 1-shot circuit of FIG. 6 further includes a NAND gate 38 having an input 39 connected to receive an optional Initialize signal whose value is active low. That is, during normal operation of the circuit, the Initialize signal is logic 1, but it can be changed to 0 briefly in order to force a reset of the flip-flops 16, 18 in order to initialize the de-glitch circuit after, for example, the circuit is first powered up. Alternatively, the Initialize signal can be omitted and the NAND gate 38 can be replaced with an inverter connected between the output of the XOR gate 32 and the output of the 1-shot circuit. As a further alternative, the XOR gate can be replaced with an inverted output XOR gate whose output constitutes the output of the 1-shot circuit 30 without any intervening NAND gate or inverter.

In the de-glitch circuit of FIG. 1, the output of the 1-shot circuit 30 is connected to the respective Reset inputs of the two flip-flops 16, 18. The input of the 1-shot circuit is connected to the input signal X through the first delay circuit 14. Therefore, the output of the 1-shot circuit produces a pulse of duration W each time the input signal X transitions from 0 to 1 or from 1 to 0, but delayed by time period D. Referring to the timing diagrams of FIGS. 2 and 3, the 1-shot circuit produces a pulse beginning at times t2 and t4. During each pulse of duration W, the output of the 1-shot circuit is logic 1; otherwise, the output is logic 0.

We refer to the first flip-flop 16 as FF-a and the second flip-flop 18 as FF-b. FF-a has uninverted inputs S and R and an uninverted output Qa. FF-b has inverted inputs S* and R* and an inverted output Qb*. FF-a preferably is implemented as the NOR-type flip-flop shown in FIG. 4 because the NOR-type flip-flop inherently has uninverted S and R inputs. FF-b preferably is implemented as the NAND-type flip-flop shown in FIG. 5 because the NAND-type flip-flop inherently has inverted S* and R* inputs.

The output of the 1-shot circuit 30 is connected directly to the R input of FF-a, and it is connected to the R* input of FF-b through an inverter 40. Therefore, except for the brief periods when the 1-shot circuit produces a logic 1 pulse, the Reset inputs of the two flip-flops FF-a and FF-b are in their inactive states (R=0 and R*=1), so that the values of the respective outputs Qa and Qb* of the two flip-flops are determined by the respective Set inputs (S and S*) of FF-a and FF-b.

The initial 0-1 transition of the input signal X at time t1 is captured by the first SR flip-flop 16 (FF-a), and the initial 1-0 transition of X at time t3 is captured by the second SR flip-flop 18 (FF-b). Specifically, because the first flip-flop FF-a has an uninverted Set input S, its output latches to the "set" state (Qa=1) when the input signal X is 1. The second flip-flop FF-b has an inverted Set inputs S*, so its output latches to the "set" state (Qb=1 or Qb*=0) when the input signal X is 0.

Consequently, when the input signal X transitions from 0 to 1 at time t1, the output Qa of FF-a is set to logic 1 and remains at that value even if X alternates between 0 and 1 because of glitches during the period between t1 and t2. Likewise, when the input signal X transitions from 1 to 0 at time t3, the output Qb* of FF-b is set to logic 0 and remains at that value even if X subsequently alternates between 0 and 1 because of glitches during the period between t3 and t4.

The output of the first delay circuit 14 is connected to a second delay circuit 42 that delays the signal by a time period D2 that can be much shorter than the delay period D of the first delay circuit 14. The output of the second delay circuit 42 is connected to an inverter 44 to produce a signal labeled as D2* that is an inverted replica of X delayed by time D plus D2.

The time period D2 should be greater than the time required for the trailing edge of a reset signal of duration W to propagate through 1-shot circuit 30, flip-flop 16, inverter 40, and flip-flop 18. The purpose of this second delay D2 is to ensure that, at times t2 and t4, the reset pulse to the flip-flops will return to 0 and the flip-flops will have time to reset before the signal at input C of the majority circuit 50 changes from 0 to 1 or vice versa. This will become clearer in the next few paragraphs which describe the majority circuit 50 and its output signal 12. The delay duration D2 is 450 picoseconds in our actually implemented preferred embodiment.

The output 12 of the de-glitch circuit is produced by a conventional 3-input majority circuit 50. A 3-input majority circuit is a circuit that outputs a 0 if two or three of its inputs are 0 and outputs a 1 if two or three of its inputs are 1. U.S. Pat. No. 4,091,293 issued May 23, 1978 to Ando, the entire content of which is hereby incorporated into this patent specification, discloses a conventional majority circuit.

The three inputs of the majority circuit 50 are designated A, B and C. As shown in FIG. 1, the A input is connected to receive the uninverted output Qa of FF-a 16, the B input is connected to receive the inverted output Qb* of FF-b 18, and the C input is connected to receive the delayed signal D2* from the inverter 44 following the second delay circuit 42. In other words, A=Qa, B=Qb* and C=D2*. In the following discussion and in the drawings, we use A and Qa interchangeably to refer to the same signal, we use B and Qb* interchangeably, and we use C and D2* interchangeably.

3. Operation

During the period from t1 to t2, D2* will remain 1 even though X has transitioned from 0 to 1. This will be true if, as stated above, the delay period D established by the delay circuit 14 is less than or equal to one-half the pulse width of the input signal X, i.e., less than or equal to one-half the shortest time between transitions of the input signal other than transitions caused by distortion.

Because Qa and D2* are both 1 during the period from t1 to t2, the output Z will be 1 during the period t1 to t2. Therefore, the circuit is immune to any glitches in the value of X during the period of duration D from t1 to t2.

At time t2, the signal XD at the output 15 of the delay circuit 14 changes from 0 to 1, thereby triggering the 1-shot circuit 30 to send a Reset pulse to both flip-flops 16, 18. By this time, there should be no more glitches in the input signal X, so the Reset pulse will reset the output Qb* of FF-b to logic 1. This, in combination with the output Qa of FF-a remaining 1, will maintain the output Z at 1 after the signal D2* returns to 0 shortly after time t2.

Beginning after the time delay D2 following time t2, the signal D2* will exhibit delayed replicas of any glitches exhibited by the input signal X between times t1 and t2. However, these glitches in D2* will not affect the output Z because both the A and B inputs of the majority circuit 50 remain 1 between times t2 and t3.

The sequence of events from time t3 to t5 is the same as the above-described sequence of events from t1 to t3, except that the roles of FF-a and FF-b are reversed.

FIG. 2 shows that the Reset signal R includes pulses not only at times t2 and t4 as described above, but also subsequently in response to each glitch in the input signal X, delayed by time D. Each glitch in the input signal X produces two Reset pulses at the leading and trailing edges, respectively, of each glitch in X. FIG. 2 shows each Reset pulse as having zero width because the actual width W, determined by the one-shot circuit 30, is too narrow to represent in FIG. 2.

The preceding discussion of the SR flip-flop circuits of FIGS. 4 and 5 stated that inverters 28 and 29 preferably are included so that the Set input overrides the Reset input of each flip-flop. If the opposite were true, so that the Reset input overrides the Set input, each pulse in the Reset signal R could produce a glitch in the output Z. Specifically, each pulse in the Reset signal R at time t2 and during the period D thereafter would produce a corresponding 0 pulse in signal A (the output of FF-a). Similarly, each pulse in the Reset signal R at time t4 and during the period D thereafter would produce a corresponding 1 pulse in signal B (the output of FF-b).

A conventional implementation of a 3-input majority circuit consists of three 2-input AND gates whose outputs are connected to the inputs of a 3-input OR gate. Referring to the three inputs of the majority circuit as A, B and C and to the output as Z, the logical function implemented by such a majority circuit is expressed by the Boolean equation:

$$Z=AB+AC+BC \qquad \text{(Equation 1)}$$

An equivalent Boolean equation expressed in terms of an inverted output Z*, useful for implementation by a 3-input NOR gate rather than 3-input OR gate, is:

$$Z^*=A^*B^*+A^*C^*+B^*C^* \qquad \text{(Equation 2)}$$

FIG. 1 of the above-referenced U.S. Pat. No. 4,091,293 to Ando shows a majority circuit implementing Equation 1.

The timing table of FIG. 3 shows that one combination of signal values that never occurs is A=0 and B=1. Therefore, in Equation 1, the expression AB+BC simplifies to B, hence Equation 1 simplifies to:

$$Z=B+AC \qquad \text{(Equation 3)}$$

Figure 7:
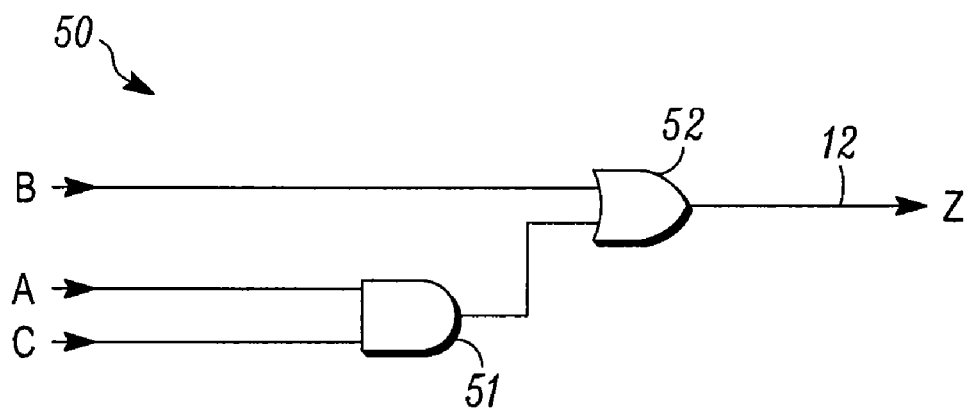
FIG. 7 is an electrical schematic of a majority circuit suitable for use in the de-glitch circuit of FIG. 1.

FIG. 7 shows an embodiment of the majority circuit 50 in accordance with Equation 3. The A and C inputs of the majority circuit 50 are connected to the respective inputs of a 2-input AND gate 51, whose output is connected to one input of a 2-input OR gate 52. The other input of the OR gate 51 is connected to the B input of the majority circuit 50, and the output of the OR gate 51 is connected to the output (Z) of the majority circuit.

Similarly, because A=0 and B=1 never occurs, Equation 2 can be simplified. Specifically, the expression A*B*+A*C* simplifies to A*, hence Equation 2 simplifies to:

$$Z^*=A^*+B^*C^* \qquad \text{(Equation 4)}$$

Figure 8:
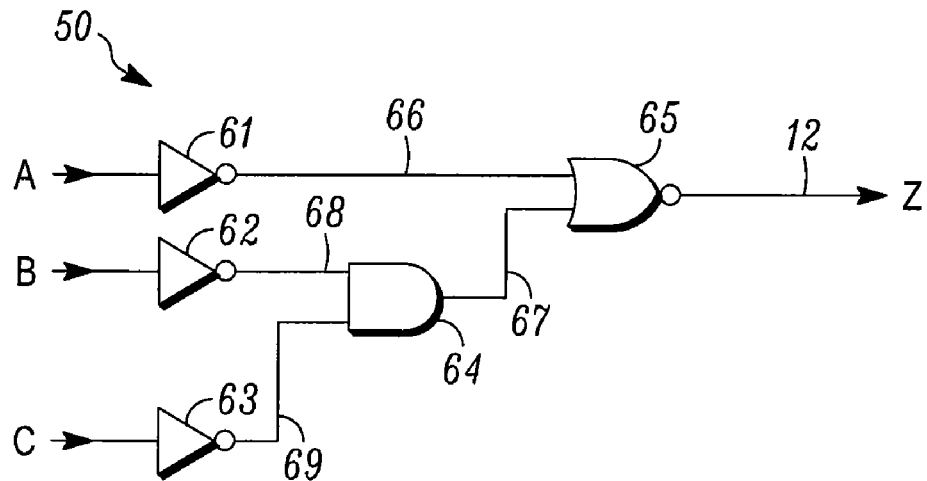
FIG. 8 is an electrical schematic of an alternative embodiment of a majority circuit having inverted logic.

FIG. 8 shows an embodiment of the majority circuit 50 in accordance with Equation 4. The B and C inputs of the majority circuit 50 are connected, through respective inverters 62 and 63, to the respective inputs 68, 69 of a 2-input AND gate 64. The output of the AND gate 64 is connected to one input 67 of a 2-input NOR gate 65. The A input of the majority circuit 50 is connected, through inverter 61, to the other input 66 of the NOR gate 65. The output of the NOR gate is connected to the output (Z) of the majority circuit.

In the FIG. 8 embodiment of the majority circuit 50, any of the inverters 61, 62 or 63 can be eliminated by connecting the corresponding input A, B or C to an inverted version of the corresponding input signal.

For example, in the preferred embodiment, the second Set-Reset Flip-Flop circuit 18 (FF-b) is implemented as the NAND-type flip-flop circuit shown in FIG. 5. The inverter 62 preferably is eliminated by connecting the upper input 68 of the AND gate 64 to the Q output of FF-b, i.e., to the output 27 of NAND gate 23 shown in FIG. 5, instead of the Q* output of FF-b. In that case, the inverter 29 shown in FIG. 5 also can be eliminated because the Q* output of FF-b is not used.

Similarly, in the preferred embodiment the first Set-Reset Flip-Flop circuit 16 (FF-a) is implemented as the NOR-type flip-flop circuit shown in FIG. 4, and the inverter 61 can be eliminated by connecting the upper input 66 of the NOR gate 65 to the Q* output of FF-a, i.e., to the output 24 of NOR gate 20 shown in FIG. 4, instead of the Q output of FF-a. In that case, the inverter 28 shown in FIG. 4 also can be eliminated because the Q output of FF-a is not used.

Inverter 44 (FIG. 1) and inverter 63 (FIG. 8) can be eliminated by connecting the output 43 of the second delay circuit 42 in FIG. 1 to the lower input 69 of the AND gate 64 in FIG. 8.

Figure 9:
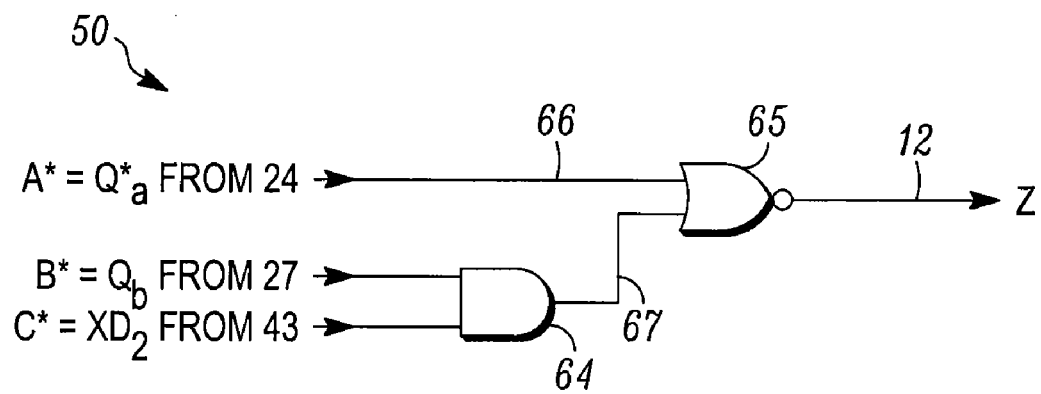
FIG. 9 is an electrical schematic of a modification of the majority circuit of FIG. 8 that eliminates the inverters of the FIG. 8 embodiment.

FIG. 9 shows how the majority circuit of FIG. 8 is simplified by eliminating inverters 61, 62 and 63 as explained in the three preceding paragraphs.

4. Alternative with Reset Input Overriding Set Input

It was explained above that it is preferable in the present invention for the Set (S) input to override the Reset (R) input of the SR flip-flops. That is, if S=R=1 or S*=R*=0, the output of the flip-flops should be the same as if S=1 and R=0 or, equivalently, S*=0 and R=1. As stated above, this behavior is achieved in the NOR-type flip-flop of FIG. 4 by deriving both the Q and Q* outputs from the output of the NOR gate whose input is connected to the S input, namely, the output 24 of the first NOR gate 20. Likewise, this behavior is achieved in the NAND-type flip-flop of FIG. 5 by deriving both the Q and Q* outputs from the output of the NAND gate whose input is connected to the S input, namely, the output 27 of the second NAND gate 23.

To illustrate the consequence connecting one of the flip-flops so that its Reset input overrides its Set input, contrary to the preferred implementation of the SR flip-flops described in the preceding paragraph, consider the previously described preferred embodiment in which the first flip-flop 16 (FF-a) in FIG. 1 is implemented as the NOR-type flip-flop shown in FIG. 4. Also consider a modification of this preferred embodiment in which the Q output of FF-a (referred to as Qa) is connected to the output 25 of the second NOR gate 21, rather than to the output of inverter 28. In that case, because Qa is supplied by the NOR gate 21 whose input is connected to the R input of FF-a, the value of Qa becomes 0 during the period of each Reset (R) pulse received by FF-a, irrespective of the value of the Set (S) input of FF-a.

Figure 10:
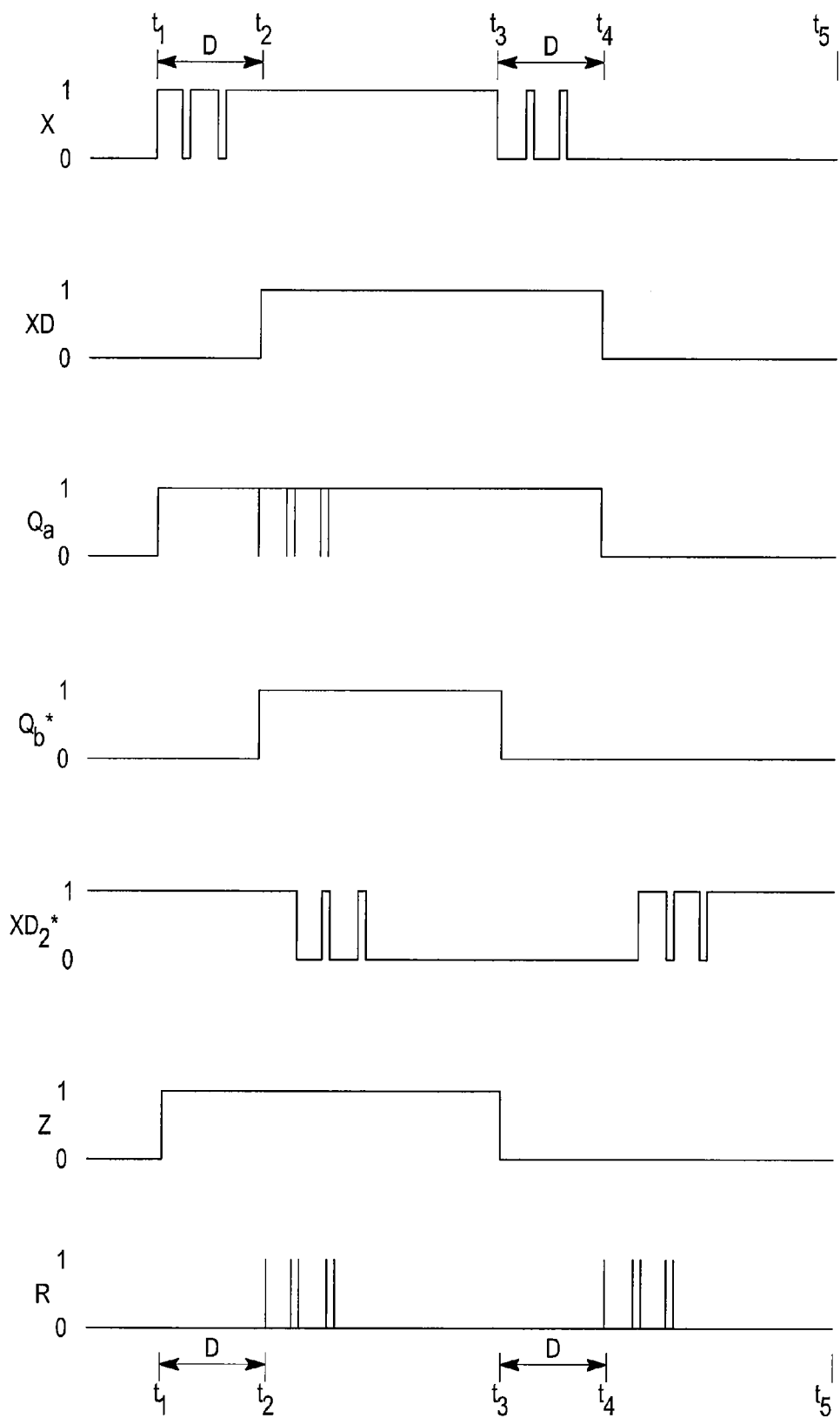
FIG. 10 is a waveform timing diagram of an alternative embodiment of the de-glitch circuit that includes the time delay circuit of FIG. 11 and the output logic circuit of FIG. 12.

FIG. 10 shows the resulting waveform of Qa=A. During the period from t2 to t3 when the input signal X remains equal to 1, rather than Qa also remaining equal to 1, Qa reverts to 0 during the period of each Reset (R) pulse. This could cause the output signal Z of the de-glitch circuit of FIG. 1 to revert to 0 during these periods, thereby defeating the purpose of the de-glitch circuit.

Two modifications of the de-glitch circuit of FIG. 1 can prevent the output signal Z from reverting to 0 even if Qa reverts to 0 during occurrences of the Reset pulse at times between t2 and t3.

Figure 11:
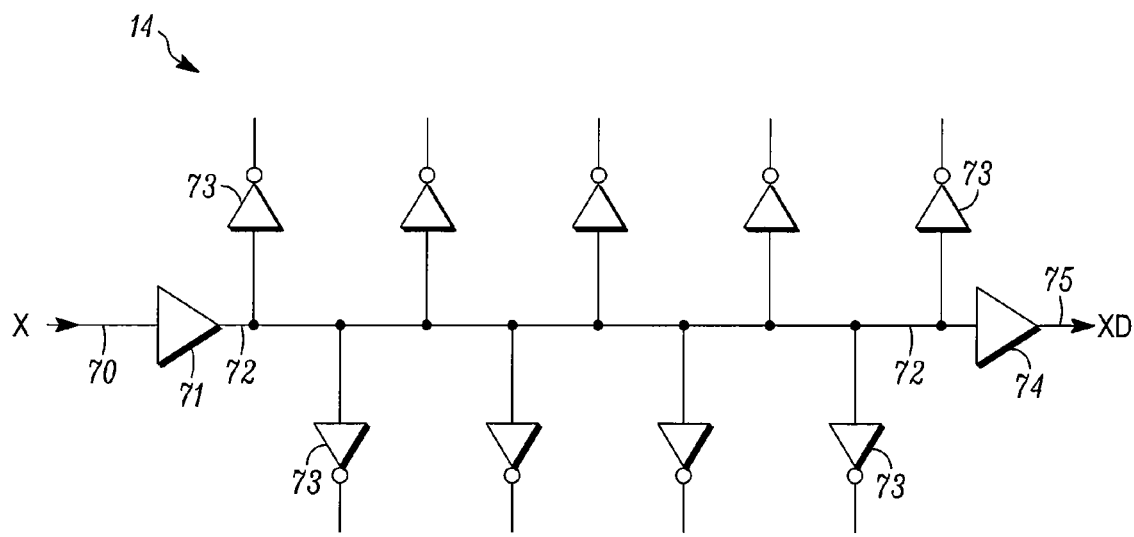
FIG. 11 is an electrical schematic of a time delay circuit that includes a low pass filter.

The first modification of the de-glitch circuit of FIG. 1 is to include in the first delay circuit 14 a low pass filter having a time constant approximately equal to the delay time D. FIG. 11 shows a preferred embodiment of such a delay circuit that includes a resistance-capacitance (RC) low pass filter.

The delay circuit of FIG. 11 has an input 70 connected to the input of a first buffer or inverter 71 and an output 75 connected to the output of a second buffer or inverter 74. The output of the first buffer or inverter 71 is connected to the input of the second buffer or inverter 74 by a conductor 72. The inputs of several additional buffers or inverters 73 are connected in parallel to the conductor 72. The outputs of the additional buffers or inverters 73 need not be connected to anything.

The resistance-capacitance low pass filter within the delay circuit of FIG. 11 has a resistance that consists primarily of the output resistance of the first buffer or inverter 71, and has a capacitance that consists primarily of the total of the respective input capacitances of the second buffer or inverter 74 and the additional buffers or inverters 73. The time constant of the low pass filter is the product of this resistance and capacitance.

The low pass filter has two effects on the signal X received at input 70. First, it interposes between its input 70 and output 75 a time delay whose duration D approximately equals the time constant of the low pass filter. Second, because all glitches in the input signal X are of much shorter duration than the low pass filter time constant, the signal XD produced at the output 75 has all glitches removed by the low pass filter. FIG. 10 shows that the signal XD produced at the output 75 of the delay circuit of FIG. 11 is a replica of input signal X delayed by time period D, but with all glitches removed.

Figure 12:
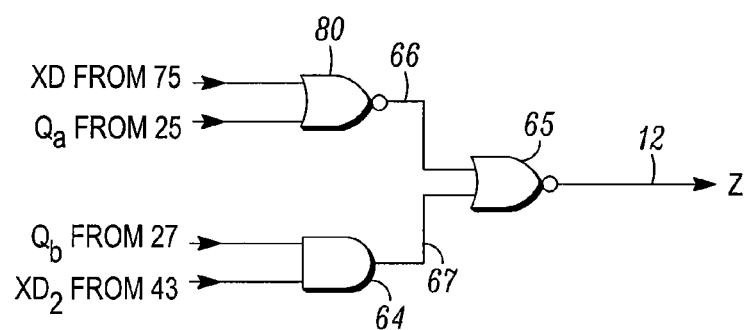
FIG. 12 is an electrical schematic of an output logic circuit that can be substituted for the majority circuit of FIG. 9.

The second modification of the de-glitch circuit of FIG. 1 is to substitute the output logic circuit shown in FIG. 12 in place of the majority circuit of FIG. 9. The output logic circuit of FIG. 12 adds to the majority circuit of FIG. 9 a NOR gate 80 interposed between the Qa output of FF-a 16 and the first input 66 of the NOR gate 65 that produces the output signal Z. The second input of NOR gate 80 is connected to receive the signal XD produced by the first delay circuit 14. The delay circuit 14 should include a low pass filter as described in the preceding discussion of FIG. 11. As shown in the waveform timing diagram of FIG. 10, the embodiment of the first delay circuit that includes a low pass filter, shown in FIG. 11, produces an output signal XD whose value remains 1 during the times between t2 and t3 that signal Qa from FF-a reverts to 0. Therefore, the output of the NOR gate 80 remains 0 throughout the time interval from t1 to t3. Consequently, the output signal Z produced by the de-glitch circuit will not include any of the glitches in the input signal X or the FF-a output signal Qa, notwithstanding that Qa reverts to 0 during each Reset pulse.

5. Conclusion

In any of the circuits disclosed or claimed in this patent specification, any inverter can be omitted if the polarity of the circuit connected to the input or output of the inverter is inverted. For example, in the circuit of FIG. 1, if the second flip-flop 18 (FF-b) has an uninverted input R, it can be connected directly to the output of the 1-shot circuit 30, and the inverter 40 can be omitted. Similarly, in the 1-short circuit shown in FIG. 6, if the exclusive OR gate 32 is replaced with an exclusive NOR gate, the NAND gate 38 can be omitted, and the output of the exclusive NOR gate can constitute the output R of the 1-short circuit. Conversely, the polarity of any circuit input or output can be inverted if it is connected to an additional inverter.

The invention claimed is

1. A de-glitch circuit having an input and an output, comprising:
a 3-input majority circuit having first, second and third inputs and having an output connected to the output of the de-glitch circuit;
a first Set-Reset flip-flop having a first Set input, a first Reset input, and a first flip-flop output, wherein the first flip-flop output is connected to the first input of the majority circuit, and wherein the first Set input is connected to the input of the de-glitch circuit;
a second Set-Reset flip-flop having a second Set input, a second Reset input, and a second flip-flop output, wherein the second flip-flop output is connected to the second input of the majority circuit, and wherein the second Set input is connected to the input of the de-glitch circuit;
a first delay circuit having an output and having an input connected to the input of the de-glitch circuit;
a second delay circuit having an input connected to the output of the first delay circuit and having an output connected to the third input of the majority circuit; and
a one-shot circuit having an input connected to the output of the first delay circuit and having an output connected to the first Reset input and the second Reset input.

2. The de-glitch circuit of claim 1, wherein:
the second Set input has inverted polarity.

3. The de-glitch circuit of claim 2, wherein:
the second flip-flop output has inverted polarity.

4. The de-glitch circuit of claim 2, further comprising:
an inverter connected between the output of the one-shot circuit and the second Reset input;
wherein the second Reset input has inverted polarity.

5. The de-glitch circuit of claim 1, further comprising:
an inverter connected between the output of the second delay circuit and the third input of the majority circuit.

6. The de-glitch circuit of claim 1, wherein:
the first Set-Reset flip-flop is a NOR-type flip flop; and
the second Set-Reset flip-flop is a NAND-type flip flop.

7. The de-glitch circuit of claim 1, wherein:
the second delay circuit is characterized by a delay time greater than or equal to the time required for both of the first and second Set-Reset flip-flops to change state in response to a signal at their respective Reset inputs.

8. The de-glitch circuit of claim 1, wherein:
the first delay circuit is characterized by a first delay time; and
the second delay circuit is characterized by a second delay time that is substantially less than the first delay time.

9. The de-glitch circuit of claim 1, wherein the majority circuit comprises:
- an AND gate having an output and having first and second inputs connected to the first and third inputs, respectively, of the majority circuit; and
- an OR gate having an output connected to the output of the majority circuit, having a first input connected to the first input of the majority circuit, and having a second input connected to the output of the AND gate.

10. The de-glitch circuit of claim 1, wherein the majority circuit comprises:
- an AND gate having an output and having first and second inputs connected to the second and third inputs, respectively, of the majority circuit; and
- a NOR gate having an output connected to the output of the majority circuit, having a first input connected to the first input of the majority circuit, and having a second input connected to the output of the AND gate.

11. The de-glitch circuit of claim 10, wherein the majority circuit further comprises:
- an inverter connected between the first input of the majority circuit and the first input of the NOR gate.

12. The de-glitch circuit of claim 10, wherein the majority circuit further comprises:
- an inverter connected between the second input of the majority circuit and the first input of the AND gate.

13. The de-glitch circuit of claim 10, wherein the majority circuit further comprises:
- an inverter connected between the third input of the majority circuit and the second input of the AND gate.

14. A de-glitch circuit having an input and an output, comprising:
- a NOR gate having first and second inputs and having an output connected to the output of the de-glitch circuit;
- an AND gate having first and second inputs and having an output connected to the second input of the NOR gate;
- a first Set-Reset flip-flop having a first Set input, a first Reset input, and a first flip-flop output, wherein the first flip-flop output is connected to the first input of the NOR gate, and wherein the first Set input is connected to the input of the de-glitch circuit;
- a second Set-Reset flip-flop having a second Set input, a second Reset input, and a second flip-flop output, wherein the second flip-flop output is connected to the first input of the AND gate, and wherein the second Set input is connected to the input of the de-glitch circuit;
- a first delay circuit having an output and having an input connected to the input of the de-glitch circuit;
- a second delay circuit having an input connected to the output of the first delay circuit and having an output connected to the second input of the AND gate; and a one-shot circuit having an input connected to the output of the first delay circuit and having an output connected to the first Reset input and the second Reset input.

15. The de-glitch circuit of claim 14, wherein:
the second Set input has inverted polarity.

16. The de-glitch circuit of claim 15, wherein:
the second flip-flop output has uninverted polarity.

17. The de-glitch circuit of claim 15, further comprising:
- an inverter connected between the output of the one-shot circuit and the second Reset input;
wherein the second Reset input has inverted polarity.

18. The de-glitch circuit of claim 14, wherein:
the first flip-flop output has inverted polarity; and
the second flip-flop output has uninverted polarity.

19. The de-glitch circuit of claim 14, further comprising:
- a second NOR gate having first and second inputs and having an output connected to the first input of the first NOR gate;
wherein the first input of the second NOR gate is connected to the first flip-flop output; and
wherein the second input of the second NOR gate is connected to the output of the first delay circuit.

20. The de-glitch circuit of claim 19, wherein:
the first flip-flop output has uninverted polarity; and
the second flip-flop output has uninverted polarity.

* * * * *